US009105741B2

(12) United States Patent
Chan et al.

(10) Patent No.: US 9,105,741 B2
(45) Date of Patent: Aug. 11, 2015

(54) METHOD OF REPLACEMENT SOURCE/DRAIN FOR 3D CMOS TRANSISTORS

(75) Inventors: Kevin K. Chan, Staten Island, NY (US); Jinghong Li, Poughquag, NY (US); Dae-Gyu Park, Poughquag, NY (US); Xinhui Wang, Poughkeepsie, NY (US); Yun-Yu Wang, Poughquag, NY (US); Qingyun Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 13/614,062

(22) Filed: Sep. 13, 2012

(65) Prior Publication Data
US 2014/0070316 A1    Mar. 13, 2014

(51) Int. Cl.
| | |
|---|---|
| H01L 21/336 | (2006.01) |
| H01L 21/8234 | (2006.01) |
| H01L 21/8238 | (2006.01) |
| H01L 27/088 | (2006.01) |
| H01L 27/092 | (2006.01) |
| H01L 21/84 | (2006.01) |
| H01L 29/78 | (2006.01) |
| H01L 27/12 | (2006.01) |

(52) U.S. Cl.
CPC ...... *H01L 21/823412* (2013.01); *H01L 21/823418* (2013.01); *H01L 21/823431* (2013.01); *H01L 21/823807* (2013.01); *H01L 21/823814* (2013.01); *H01L 21/823821* (2013.01); *H01L 21/845* (2013.01); *H01L 27/0886* (2013.01); *H01L 27/0924* (2013.01); *H01L 27/1211* (2013.01); *H01L 29/7848* (2013.01)

(58) Field of Classification Search
CPC ............ H01L 29/66795; H01L 29/785; H01L 29/7848; H01L 29/66636; H01L 21/02532; H01L 21/823431; H01L 27/0886; H01L 29/66628; H01L 21/823821; H01L 29/1054; H01L 27/0924; H01L 21/823412; H01L 21/823418; H01L 21/823807; H01L 21/823814; H01L 27/1211; H01L 21/845
USPC ............. 257/347, E21.09, E21.431; 438/157, 438/283, 300
See application file for complete search history.

(56) References Cited

U.S. PATENT DOCUMENTS

| | | | |
|---|---|---|---|
| 7,939,413 B2 | 5/2011 | Chong et al. | |
| 2006/0151837 A1 | 7/2006 | Chen et al. | |
| 2008/0124874 A1 | 5/2008 | Park et al. | |
| 2009/0140302 A1* | 6/2009 | Onoda | .......................... 257/288 |
| 2011/0049630 A1 | 3/2011 | Majumdar et al. | |
| 2011/0089467 A1 | 4/2011 | Chang et al. | |
| 2011/0147828 A1* | 6/2011 | Murthy et al. | ................. 257/327 |
| 2011/0287600 A1* | 11/2011 | Cheng et al. | .................. 438/299 |

(Continued)

*Primary Examiner* — Khiem D Nguyen
(74) *Attorney, Agent, or Firm* — Howard M. Cohn; H. Daniel Schnurmann

(57) ABSTRACT

A method of forming a semiconductor structure may include forming at least one fin and forming, over a first portion of the at least one fin structure, a gate. Gate spacers may be formed on the sidewalls of the gate, whereby the forming of the spacers creates recessed regions adjacent the sidewalls of the at least one fin. A first epitaxial region is formed that covers both one of the recessed regions and a second portion of the at least one fin, such that the second portion extends outwardly from one of the gate spacers. A first epitaxial layer is formed within the one of the recessed regions by etching the first epitaxial region and the second portion of the at least one fin. A second epitaxial region is formed at a location adjacent one of the spacers and over the first epitaxial layer within one of the recessed regions.

13 Claims, 12 Drawing Sheets

(56) References Cited

U.S. PATENT DOCUMENTS

| | | |
|---|---|---|
| 2012/0001228 A1 | 1/2012 | Chong et al. |
| 2012/0223364 A1* | 9/2012 | Chung et al. .................. 257/192 |
| 2013/0161756 A1* | 6/2013 | Glass et al. ................... 257/369 |
| 2014/0312431 A1* | 10/2014 | Tsai et al. ..................... 257/401 |

* cited by examiner

METHOD OF REPLACEMENT SOURCE/DRAIN FOR 3D CMOS TRANSISTORS

BACKGROUND a. Field of the Invention

The present invention generally relates to semiconductor devices, and more particularly, to forming source/drain regions in 3D CMOS structures.

b. Background of Invention

Providing stress within the source/drain (S/D) regions of, for example, planar CMOS transistors, may account for about a 25 to 35 percent enhancement in device performance that is attributable to increased channel mobility. Generally, in 2-dimensional (2D) transistor structures, embedded silicon-germanium (SiGe) or silicon-carbon (Si:C) S/D regions may exert compressive or tensile stress on the channel region of the device.

However, 3-dimensional devices such as FinFet transistors may typically include raised S/D regions and may not, therefore, have embedded (S/D) regions capable of exerting sufficient longitudinal stress within the channel region of the Fin in comparison to 2D planar structures.

BRIEF SUMMARY

According to some embodiments, in a 3D semiconductor structure such as a FinFet device, S/D regions may be formed in order to replace a portion of the FinFet device's Fin structure, whereby the formed S/D regions provide an increased stress within the channel region associated with the remaining portion of the Fin.

According to at least one exemplary embodiment, a method of forming a semiconductor structure may include providing a buried oxide layer having a surface and forming, on the surface of the buried oxide layer, at least one fin having sidewalls. A gate structure having sidewalls may be formed over a first portion of the at least one fin structure, whereby a channel region is located under the gate structure within the first portion of the at least one fin. Gate spacers are formed on the sidewalls of the gate structure such that the forming of the gate spacers creates recessed regions within the surface of the buried oxide layer at a location adjacent the sidewalls of the at least one fin. A first epitaxial region is formed that covers both one of the recessed regions and a second portion of the at least one fin, whereby the second portion extends outwardly from one of the gate spacers. A first epitaxial layer may then be formed within the one of the recessed regions by etching the first epitaxial region and the second portion of the at least one fin down to the surface of the buried oxide layer. A second epitaxial region is formed over both the surface of the buried oxide layer at a location adjacent the one of the gate spacers and the first epitaxial layer within the one of the recessed regions.

According to another exemplary embodiment, a semiconductor structure may include a buried oxide layer and recessed regions having liner layers, whereby the recessed regions are located within the buried oxide layer. At least one fin may be located on the buried oxide layer such that the at least one fin includes opposing sidewalls and opposing end facets. The recessed regions are separated by the opposing end facets of the at least one fin and extend outwardly with respect to the opposing end facets of the at least one fin. A gate structure having opposing sidewalls is also provided such that the gate structure is located over the at least one fin. A channel is created under the gate structure within the at least one fin. A spacer pair is located on the opposing sidewalls of the gate structure and is substantially coplanar with the opposing end facets of the at least one fin. An epitaxial region is located adjacent one of the spacer pair and over the liner layers of the recess regions associated with one of the opposing end facets of the at least one fin. The epitaxial region abuts the one of the opposing end facets of the at least one fin, whereby the epitaxial region provides stress on the channel based on the liner layers of the recess regions associated with one of the opposing end facets of the at least one fin.

According to another exemplary embodiment, a design structure tangibly embodied in a machine readable medium for designing, manufacturing, or testing an integrated circuit may also be provided. The design structure may include a buried oxide layer and recessed regions having liner layers, whereby the recessed regions are located within the buried oxide layer. At least one fin may be located on the buried oxide layer such that the at least one fin includes opposing sidewalls and opposing end facets. The recessed regions are separated by the opposing end facets of the at least one fin and extend outwardly with respect to the opposing end facets of the at least one fin. A gate structure having opposing sidewalls is also provided such that the gate structure is located over the at least one fin. A channel is created under the gate structure within the at least one fin. A spacer pair is located on the opposing sidewalls of the gate structure and is substantially coplanar with the opposing end facets of the at least one fin. An epitaxial region is located adjacent one of the spacer pair and over the liner layers of the recess regions associated with one of the opposing end facets of the at least one fin. The epitaxial region abuts the one of the opposing end facets of the at least one fin, whereby the epitaxial region provides stress on the channel based on the liner layers of the recess regions associated with one of the opposing end facets of the at least one fin.

According to yet another exemplary embodiment, a method of applying stress to a channel region of a FinFet structure having at least one fin structure is provided. The method may include forming a gate structure over a first portion of the at least one fin structure such that the first portion of the at least one fin structure may have a first and a second end facet. A first spacer and a second spacer are formed on respective sidewalls of the gate structure. A second portion of the at least one fin structure is then removed, whereby the second portion extends outwardly beyond the first spacer. A third portion of the at least one fin structure is also removed, whereby the third portion extends outwardly beyond the second spacer. A first epitaxial region is deposited over at least one epitaxial layer in place of the removed second portion of the at least one fin structure such that the deposited epitaxial region abuts the first end facet of the first portion of the at least one fin structure. A second epitaxial region is deposited over at least one other epitaxial layer in place of the removed third portion of the at least one fin structure, whereby the deposited epitaxial region abuts the second end facet of the first portion of the at least one fin structure. The first epitaxial region and the second epitaxial region apply stress to the channel region located under the gate structure within the first portion of the at least one fin.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following described exemplary embodiments include the formation of source/drain regions in 3-dimensional CMOS structures such as FinFet devices, whereby the formed source/drains regions provide enhanced stress for increasing, among other things, carrier mobility within the FinFet channel region.

Figure 1:
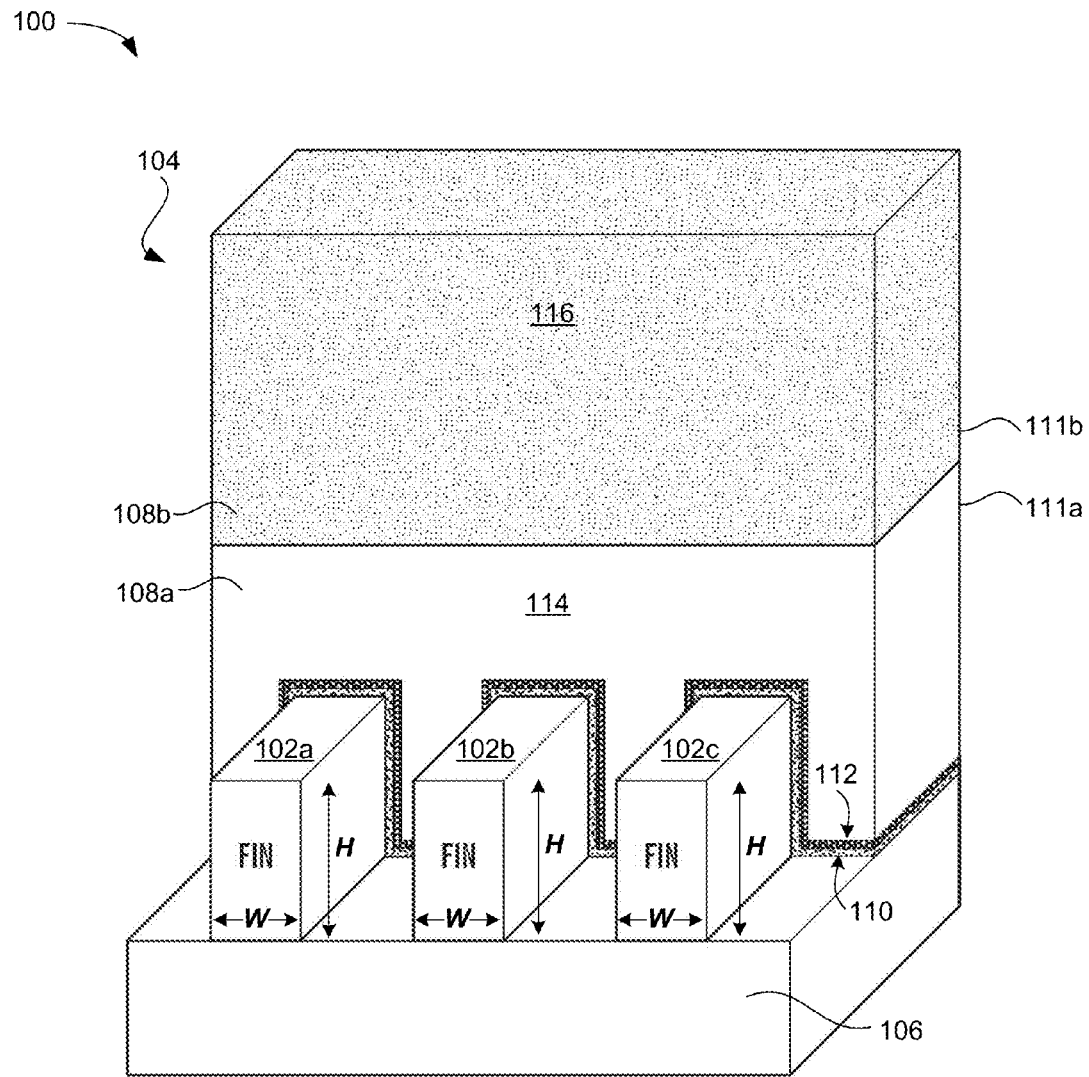
FIG. 1 is a isometric view of a FinFET structure having multiple fins, according to an exemplary embodiment.

Referring to FIG. 1, an isometric view of a FinFET structure 100 having multiple fins 102a-102c and a gate structure 104 is provided. The multiple fins 102a-102c and gate structure 104 are formed over a buried oxide layer (BOX) 106 that includes an insulator material such as, for example, silicon oxide or silicon nitride. Typically, the BOX layer 106 is formed over a substrate layer (not shown) including a semiconductor material, which may be single crystalline, polycrystalline, or an amorphous type material.

For example, the semiconductor material used to form the multiple fins 102a-102c may include a single crystal structure having epitaxial alignment. The semiconductor material may include, but is not limited to, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, or other compound semiconductor materials. According to one implementation, the semiconductor material may, for example, include silicon.

The multiple fins 102a-102c may be doped with electrical dopants. For example, the electrical dopants may include p-type dopants such as either boron (B), gallium (Ga), or indium (In). Alternately, the electrical dopants may be selected to be n-type dopants such as phosphorous (P), arsenic (As), or antimony (Sb). The atomic concentration of the electrical dopants in the multiple fins 102a-102c may be from about $1.0 \times 10^{15}/cm^3$ to about $1.0 \times 10^{19}/cm^3$, and typically from about $1.0 \times 10^{16}/cm^3$ to about $1.0 \times 10^{18}/cm^3$, although lesser and greater concentrations may be contemplated.

Each of the multiple fins 102a-102c may have a height, as defined by H, and a width, as defined by W. The height H of each of the fins 102a-102c may vary from about 10 nm to about 200 nm, and typically from about 40 nm to about 120 nm. The width W of each of the multiple fins 102a-102c may be from about 10 nm to about 150 nm, and typically from about 20 nm to about 75 nm. The length of each of the multiple fins 102a-102c may be from about 50 nm to about 2000 nm, and typically from about 100 nm to about 500 nm. Lesser or greater fin heights H, lengths L, and widths W may also be contemplated.

FIG. 1 depicts only a portion of the multiple fins 102a-102c extending through sidewall 108a of the gate electrode 114. However, the remaining portions 111a of the multiple fins 102a-102c extend through an opposing sidewall (not shown) to sidewall 108a in a substantially similar manner to the depicted portion of the multiple fins 102a-102c. In the exemplary embodiment illustrated, a multiple fin structure having three (3) fins is shown. However, any number of fins may be contemplated. For example, according to different implementations, anywhere in the range of 1-64 fins may be formed on BOX 106.

As further shown in FIG. 1, gate structure 104 may include a high-K metal gate structure having a high-k dielectric layer 110 that is formed over a region of the surfaces of the multiple fins 102a-102c, a metallic layer 112 formed over the a high-k dielectric layer 110, a gate electrode 114 formed over the metallic layer 112, and a gate hardmask cap 116 deposited over the gate electrode 114.

The high-k dielectric layer 110 may include, for example, a high-K metal oxide based material such as, but not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, or $Y_2O_xN_y$. The metallic layer 112 may, for example, include a titanium nitride (TiN) layer. During a gate last process, the gate electrode 114 may include a polysilicon material that is subsequently removed (i.e., via an etch process) and replaced (i.e., via a deposition process) by a metal fill material such as, for example, Aluminum (Al) or Tungsten (W).

Figure 2A:
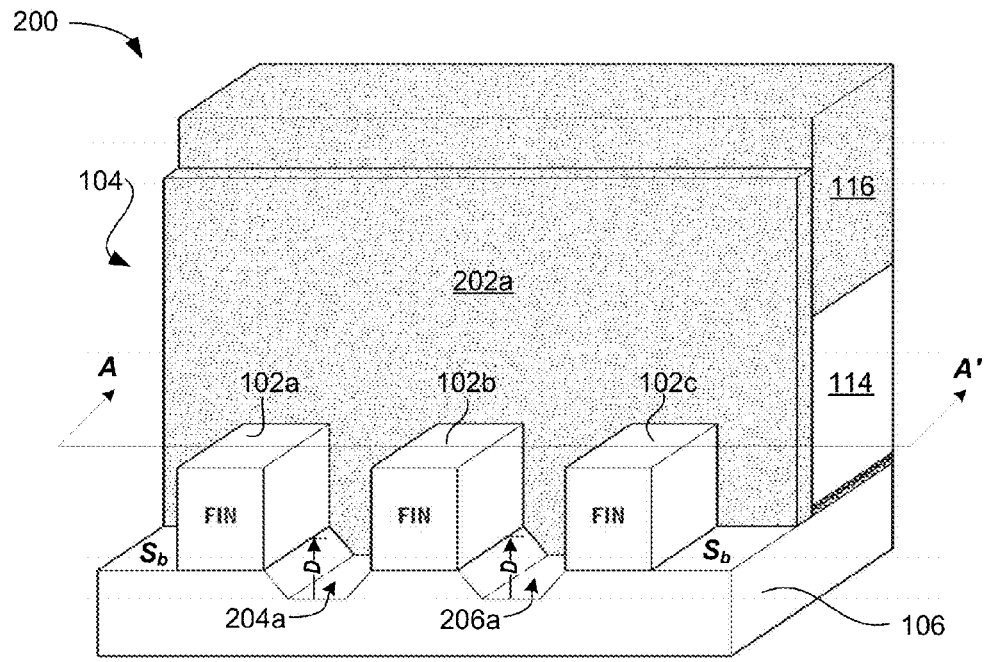
FIG. 2A is a isometric view illustrating the formation of spacers within the FinFET structure of FIG. 1, according to an exemplary embodiment.

FIG. 2A is an isometric view of a FinFET 200 structure following the subsequent formation of spacers 202a and 202b (FIG. 2B) over respective gate structure sidewalls 108a-108b (FIG. 1) and 111a-111b (FIG. 1) of FinFET structure 100 (FIG. 1). Although gate structure sidewall 108a-108b (FIG. 1) includes opposing gate sidewall 111a-111b (FIG. 1), it may be appreciated that only the surface area of sidewall 108a-108b (FIG. 1) is illustrated in FIG. 1. Accordingly, only spacer 202a is depicted in FIG. 2A. However, referring to FIG. 2B, which depicts a plan view of FIG. 2A, spacer 202b formed over opposing gate sidewall 111a-111b (FIG. 1) is shown.

Figure 2B:
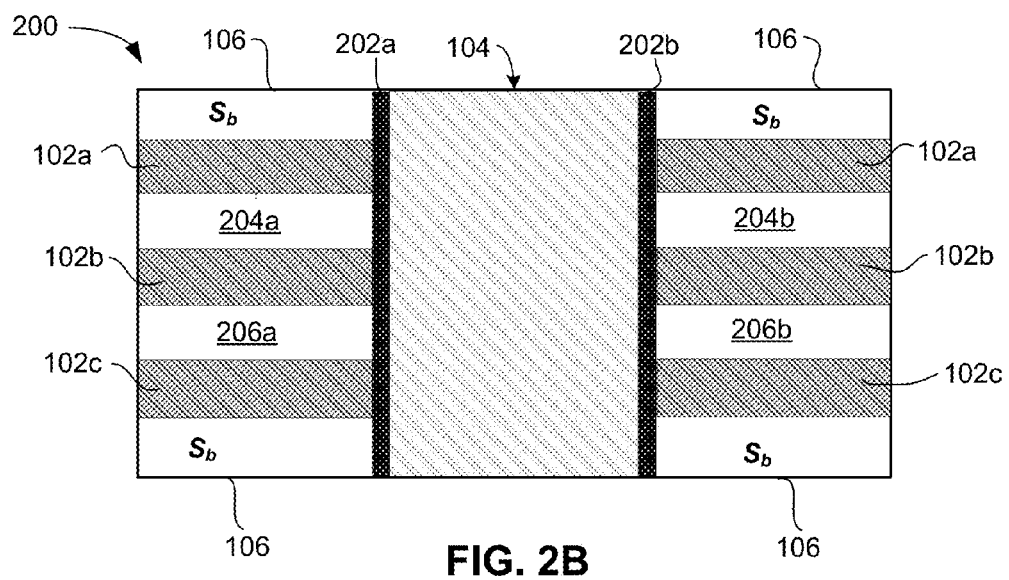
FIG. 2B is a plan view of the structure of FIG. 2A.

Referring to FIG. 2A, during the reactive ion etching (RIE) process associated with the formation of spacers 202a and 202b (FIG. 2B), recessed regions 204a, 206a, 204b (FIG. 2B), and 206b (FIG. 2B) may be created within the surface $S_b$ of BOX layer 106 as result of the etch process undercutting the BOX 106. Although the isometric view of FIG. 2A shows the recessed regions 204a, 206a corresponding to formed spacer 202a, referring to FIG. 2B, which is a plan view of FIG. 2A, also depicts the recessed regions 204b, 206b associated with formed spacer 202b. For brevity, only recessed regions 204a, 206a 204b, and 206b are illustrated in FIGS. 2A and 2B. However, additional recessed regions located between additional fin structures may also be contemplated. The depth of recessed regions 204a, 206a, 204b (FIG. 2B), and 206b (FIG. 2B), as defined by D, may be approximately 5-30 nanometers (nm), although deeper or shallower depths may also be contemplated.

Figure 2C:
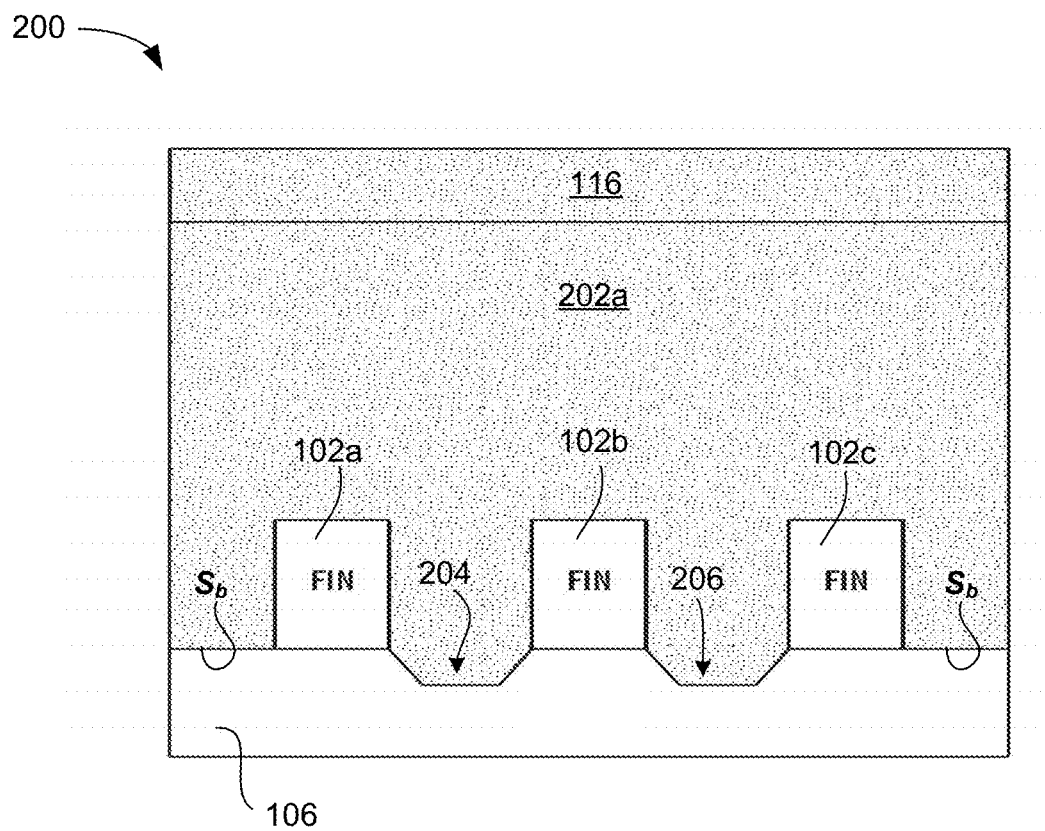
FIG. 2C is cross sectional view of the structure of FIG. 2A along axis A-A'.

FIG. 2C depicts a cross sectional view of the structure of FIG. 2A along axis A-A'. Referring to FIG. 2C also shows recessed regions 204a and 206a within the surface $S_b$ of BOX layer 106 based on the spacer formation RIE process.

The gate spacers 202a, 202b may be formed on the sidewalls of gate electrode 104 by, for example, low pressure chemical vapor deposition (LPCVD) of a dielectric layer. The gate spacers 202a, 202b may protect the gate structure 104 (i.e., High-K metal gate structure) and electrically isolate the gate electrode 114 from electrical cross-talk that may occur with any electrical contacts that are formed with respect to subsequently grown epitaxially S/D regions (see FIGS. 5A-5C).

For example, the dielectric materials used to form the gate spacers 202a, 202b may include silicon oxide, silicon nitride, or silicon oxynitride. The thickness of the gate spacers 202a, 202b, as measured at the surface $S_b$ of the BOX 106, may be in the range of about 2-100 nm, and preferably from about 6-10 nm, although lesser and greater thicknesses may also be contemplated.

Figure 3A:
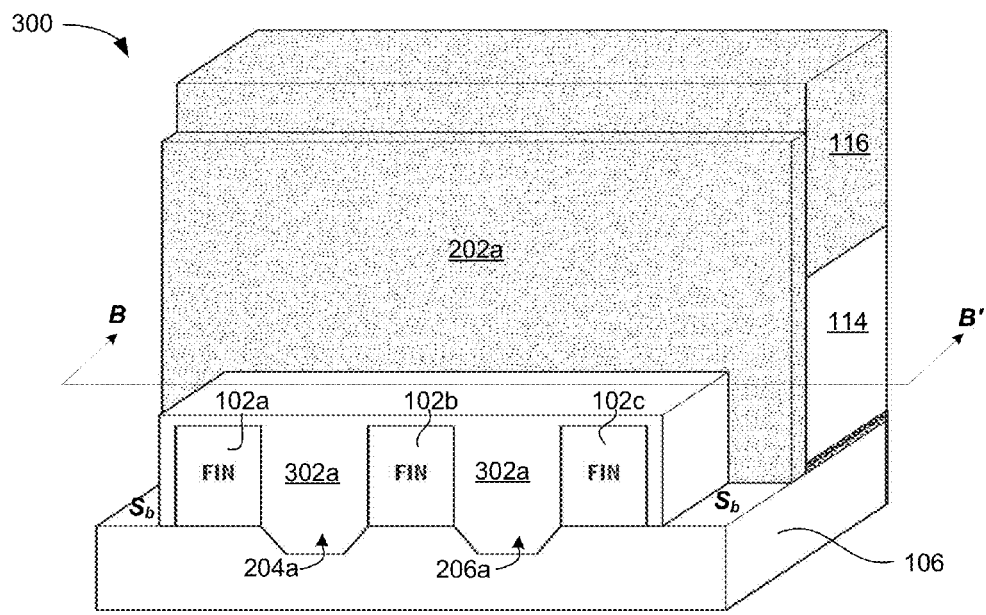
FIG. 3A is a isometric view illustrating the formation of an epitaxial region within the FinFET structure of FIG. 2A, according to an exemplary embodiment.

FIG. 3A is an isometric view of a FinFET 300 structure following the subsequent epitaxial growth of silicon (Si) source/drain regions 302a and 302b (FIG. 3B) over the multiple fins 102a-102c (FIGS. 2A & 2B) of FinFET structure 200 (FIGS. 2A & 2B). As illustrated, source/drain region 302a is epitaxially grown over the multiple fins 102a-102c adjacent to spacer 202a and within recess regions 204a and 206a of surface $S_b$ of the BOX layer 106. Similarly, referring to FIG. 3B, which is a plan view of FIG. 3A, source/drain region 302b is epitaxially grown over the multiple fins 102a-102c (FIG. 2B) adjacent to spacer 202b (FIGS. 2B & 3B) and within recess regions 204b and 206b (FIG. 2B) of the BOX layer 106.

Figure 3B:
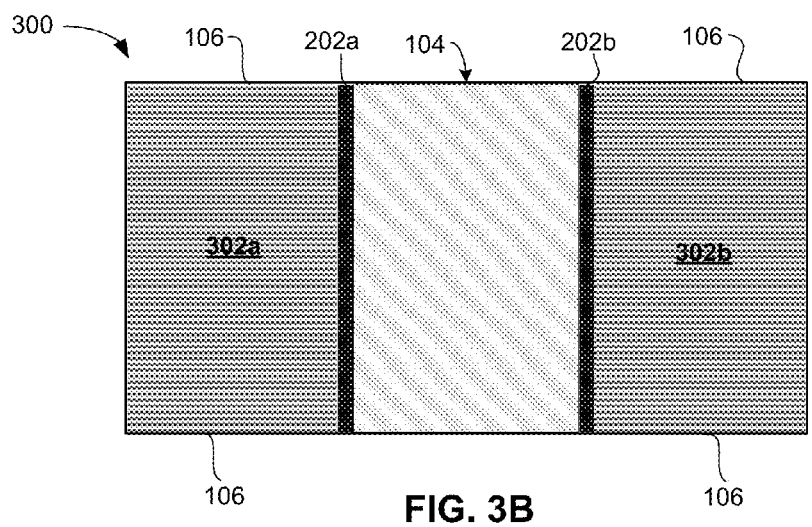
FIG. 3B is a plan view of the structure of FIG. 3A.
Figure 3C:
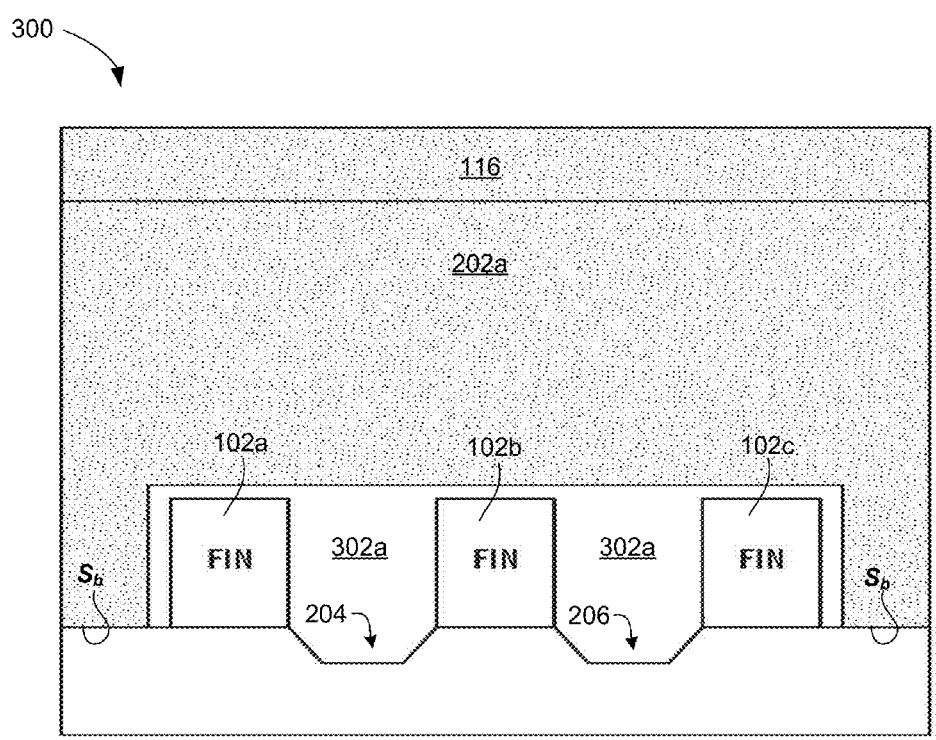
FIG. 3C is cross sectional view of the structure of FIG. 3A along axis B-B'.

FIG. 3C depicts a cross sectional view of the structure of FIG. 3A along axis B-B'. Referring to FIG. 3C also shows Si source/drain region 302a which is epitaxially grown over the multiple fins 102a-102c that are adjacent to spacer 202a and within the recess regions 204a, 206a.

Figure 4A:
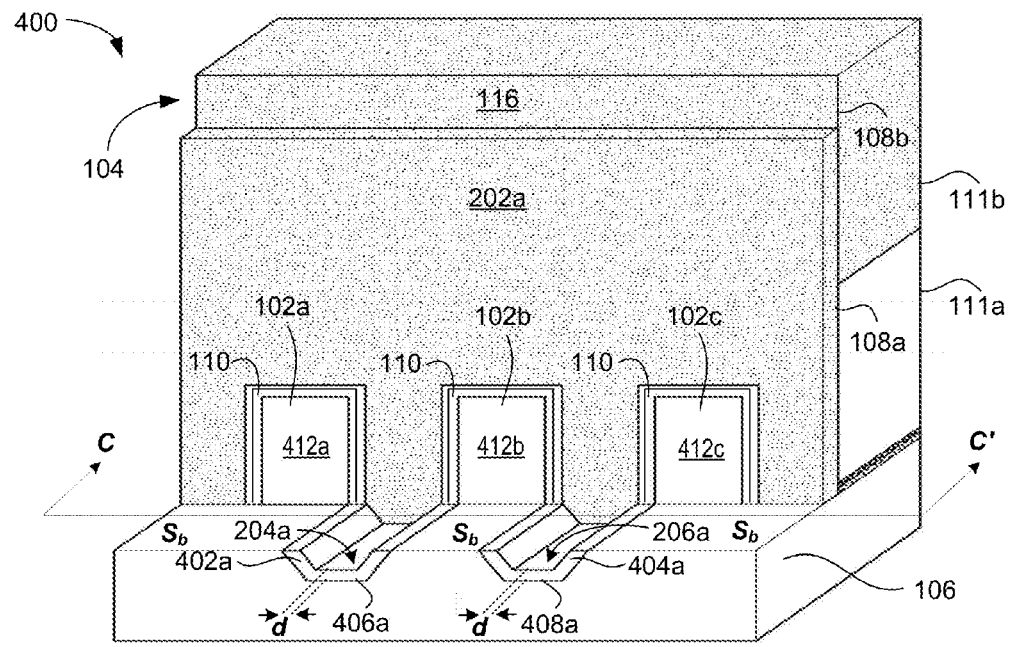
FIG. 4A is a isometric view illustrating the formation of a seed layer within the FinFET structure of FIG. 3A, according to an exemplary embodiment.

FIG. 4A is an isometric view of a FinFET structure 400 following the subsequent etching of both the epitaxially grown Si source/drain regions 302a, 302b (FIGS. 3A & 3B) and portions of the multiple fins 102a-102c (FIGS. 3A & 3B) that are located under the epitaxially grown Si source/drain regions 302a, 302b (FIGS. 3A & 3B). As illustrated, the Si source/drain regions 302a, 302b (FIGS. 3A & 3B) and portions of the multiple fins 102a-102c (FIGS. 3A & 3B) that are located under epitaxially grown Si source/drain regions 302a, 302b (FIGS. 3A & 3B) are etched down to the surface $S_b$ of the BOX layer 106. Following this etch process, epitaxially grown silicon (Si) seed layers 402a and 404a remain within recess regions 204a and 206a, respectively. The epitaxial seed layers 402a, 404a may be created by controllably etching away the Si source/drain regions 302a, 302b (FIGS. 3A & 3B) to within a distance d of floor 406a and 408a of recess regions 204a and 206a, respectively. The thickness of the epitaxial seed layers 402a, 404a, as defined by d, may be approximately 5 angstroms (Å), although thicker or thinner thicknesses may also be contemplated.

Figure 4B:
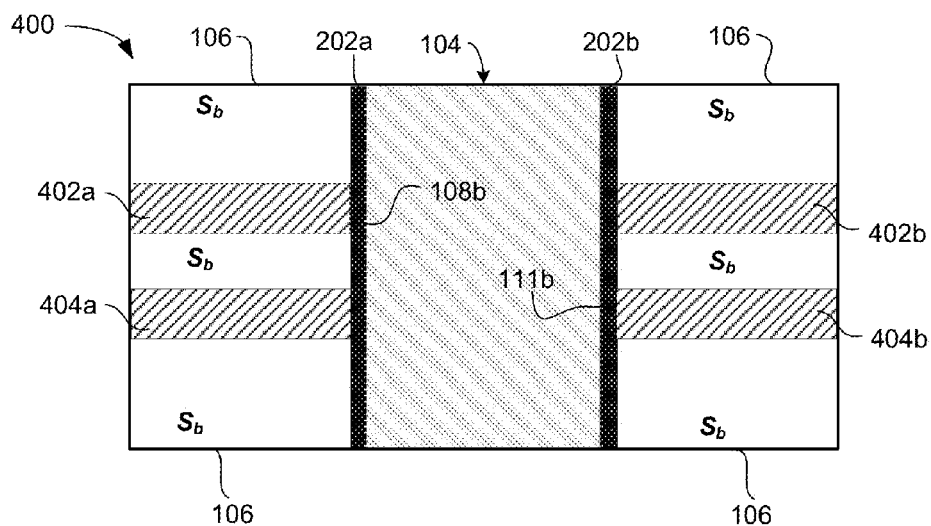
FIG. 4B is a plan view of the structure of FIG. 4A.

Similarly, referring to FIG. 4B, which is a plan view of FIG. 4A, epitaxial seed layers 402b and 404b are also created during the controllable etching of the Si source/drain regions 302a, 302b (FIGS. 3A & 3B). The thickness of epitaxial seed layers 402b and 404b within recess regions 204b (FIG. 2B) and 206b (FIG. 2B), respectively, may also be approximately 5 angstroms (Å), although thicker or thinner thicknesses may also be contemplated.

Referring to FIGS. 4A and 4B, epitaxial seed layers 402a, 404a, 402b, 404b form a liner or base layer for receiving subsequently grown source/drain regions that include stressor materials (e.g., in-situ doped Boron-SiGe or SiC:P). The epitaxial seed or liner layers 402a, 404a, 402b, 404b provide an exchange of crystalline stress between the surfaces of epitaxial seed or liner layers 402a, 404a, 402b, 404b and any subsequently grown source/drain regions including stressor materials.

Without the epitaxial seed or liner layers 402a, 404a, the source/drain regions including stressor materials would be grown directly on the amorphous type material (e.g., silicon nitride—$Si_3N_4$) of the BOX layer 106. However, an amorphous material is incapable of being stressed by the crystalline structure of a grown source/drain regions including stressor materials. Thus, in contrast, by subsequently growing source/drain regions that include stressor materials (e.g., in-situ doped Boron-SiGe or SiC:P) over the epitaxially grown silicon (Si) seed layers 402a, 404a, 402b, 404b, lattice stress is transferred between the source/drain regions having stressor materials (e.g., in-situ doped Boron-SiGe or SiC:P) and the underlying Si material of the seed layers 402a, 404a, 402b, 404b, which has a different lattice constant to that of the source/drain regions.

As illustrated in FIGS. 4A and 4B, the epitaxial seed layers 402a, 404a, 402b, 404b are formed within recessed regions 204a, 206a, 204b, 206b (FIG. 2B). Upon formation of the epitaxial seed layers 402a, 404a, 402b, 404b, the regions above the epitaxial seed layers 402a, 404a, 402b, 404b remain recessed relative to the surface $S_b$ of the BOX layer 106. As illustrated and described in the following paragraphs, this recess, as defined by $R_s$ (see FIG. 4C), provides the mechanism for forming an embedded stressor by subsequently depositing source/drain regions including stressor materials over the recessed epitaxial seed layers 402a, 404a, 402b, 404b within recess $R_s$.

Figure 4C:
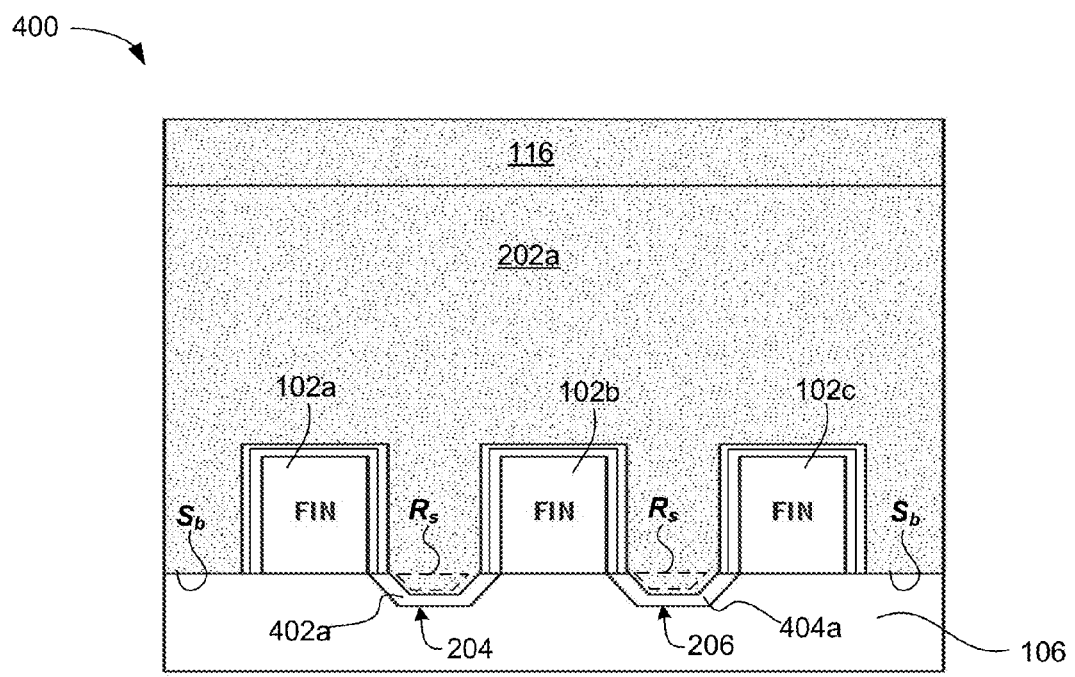
FIG. 4C is cross sectional view of the structure of FIG. 4A along axis C-C'.

FIG. 4C depicts a cross sectional view of the structure of FIG. 4A along axis C-C'. Referring to FIG. 4C, epitaxial seed layers 402a and 404a forming the liner or base layers within respective recess regions 204 and 206 (e.g., in-situ doped Boron-SiGe or SiC:P) are illustrated. FIG. 4C also depicts the recess region $R_s$ used for receiving any deposited source/drain regions including stressor materials.

As shown in FIGS. 4A and 4B, the regions of the multiple fins 102a-102c extending beyond spacers 202a and 202b are removed during the etching of the Si source/drain regions 302a, 302b (FIGS. 3A & 3B). Thus, the multiple fins 102a-102c now extend between the spacers 202a, 202b such that the opposing end-facets of the multiple fins 102a-102c are substantially flush with the outer-surface of the spacers 202a, 202b. For example, end facets 412a, 412b, and 412c of multiple fins 102a, 102b, and 102c, respectively, are substantially flush with the outer-surface of the spacer 202a. As shown, the epitaxial seed layers 402a, 404a, 402b, 404b formed within recessed regions 204a, 206a, 204b, 206b (FIG. 2B) are separated by opposing side walls 108a-108b and 111a-111b of gate structure 104, and spacers 202a and 202b.

Following the removal of the regions of the multiple fins 102a-102c that extend beyond spacers 202a and 202b, subsequently deposited source/drain regions having stressor materials may directly abut against the end facets 412a, 412b, 412c of the multiple fins 102a, 102b, 102c and, therefore, apply stress to the channel regions associated the multiple fins 102a, 102b, 102c.

Figure 5A:
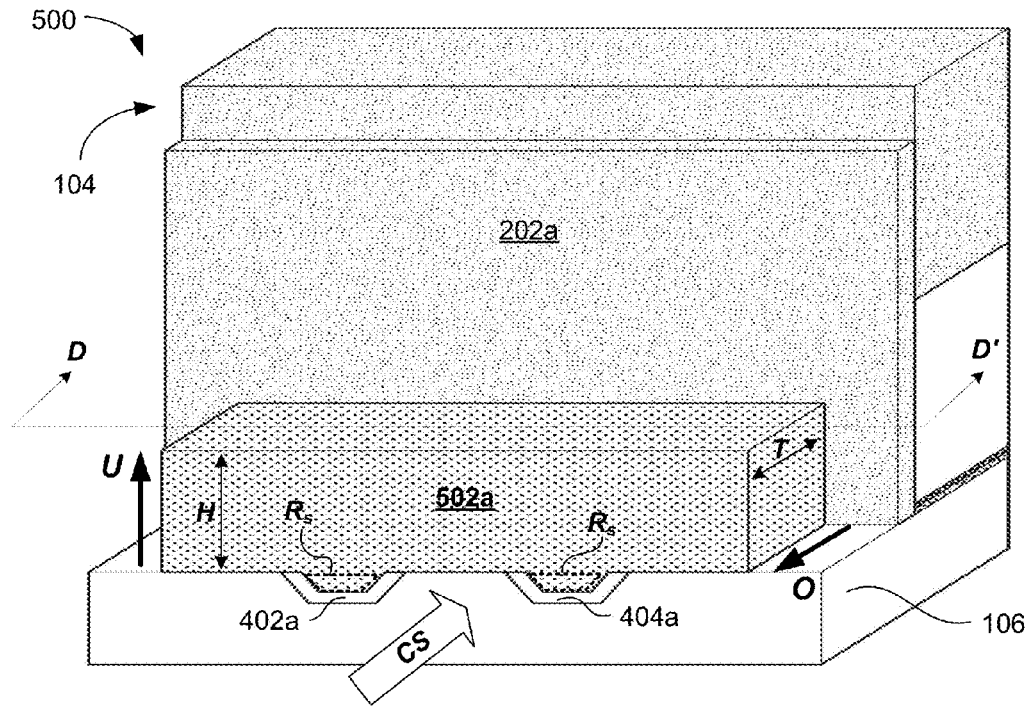
FIG. 5A is a isometric view illustrating the formation of a epitaxial source/drain stressor region for the FinFET structure of FIG. 4A, according to an exemplary embodiment.

FIG. 5A is an isometric view of a FinFET structure 500 following the deposition of source/drain regions 502a, 502b (FIG. 5B) including stressor materials (e.g., Boron-SiGe) over the recessed epitaxial seed layers 402a, 404a, 402b (FIG. 4B), 404b (FIG. 4B) within the recesses regions $R_s$ (FIG. 4C) of FinFET structure 400. As depicted, the source/drain regions 502a, 502b (FIG. 5B) are deposited over the BOX layer 106 filling the recesses regions $R_s$, while abutting the end facets 412a, 412b, 412c (FIG. 4A) of the multiple fins 102a, 102b, 102c (FIG. 4A). As illustrated in FIG. 5C, which is a cross sectional view of FIG. 5A along axis D-D'; region A of the rear surface of source/drain region 502a abuts end facet 412a (FIG. 4A) of fin 102a (FIG. 4A); region B of the rear surface of source/drain region 502a abuts end facet 412b (FIG. 4A) of fin 102b (FIG. 4A); and region C of the rear surface of source/drain region 502a abuts end facet 412c (FIG. 4A) of fin 102c (FIG. 4A). Source/drain region 502b (FIG. 5B) abuts the opposing end facets (not shown) of facets 412a, 412b, and 412c in an identical or substantially similar manner to that illustrated in relation to FIG. 5A.

For example, for a pFET FinFET device, the epitaxially grown source/drain regions 502a, 502b (FIG. 5B) may include a silicon germanium (SiGe) type material, where the atomic concentration of germanium (Ge) may range from about 10-80%, preferably from about 20-60%. In a preferred exemplary embodiment, the concentration of germanium (Ge) may be 50%.

The SiGe source/drain regions 502a, 502b (FIG. 5B) provide a compressive strain in relation to the underlying epitaxial seed layers 402a, 404a, 402b (FIG. 4B), 404b (FIG. 4B) and the end facets 412a, 412b, 412c (FIG. 4A) of the multiple fins 102a, 102b, 102c (FIG. 4A). Thus, the SiGe epitaxially grown source/drain regions 502a, 502b (FIG. 5B) exert a longitudinal compressive strain in the direction of arrows CS with respect to the remaining portions of the multiple fins 102a, 102b, 102c that extend between spacers 202a and 202b. More particularly, the compressive strain between the SiGe source/drain regions 502a, 502b (FIG. 5B) and the underlying epitaxial seed layers 402a, 404a, 402b (FIG. 4B), 404b (FIG. 4B) is transferred directly to the end facets 412a, 412b, 412c, which are proximally located with respect to the channel region (not shown) of the multiple fins 102a, 102b, 102c underlying the gate structure 104. Additionally, compressive stress to the channel region is also provided between the SiGe source/drain regions 502a, 502b (FIG. 5B) and the surfaces of the end facets 412a, 412b, 412c abutting the SiGe source/drain regions 502a, 502b (FIG. 5B).

In contrast to the illustrated and described embodiment of FIG. 5A, the portions of the multiple fins 102a-102c (FIGS. 2A & 2B) that extend out from the gate spacers 202a, 202b (FIGS. 2A & 2B) may be retained (i.e., not etched away), and SiGe source/drain regions (not shown) providing compressive strain may be grown over these extended portions. In such a contrasting implementation, however, compressive strain may be transferred indirectly from the SiGe source/drain regions to the channel region via the extended portions of the multiple fins 102a-102c (FIGS. 2A & 2B). Accordingly, less stress may be transferred to the channel region relative to the exemplary embodiment of FIG. 5A, whereby the portions of the multiple fins 102a-102c (FIGS. 2A & 2B) that extend out from the gate spacers 202a, 202b (FIGS. 2A & 2B) are removed and replaced by SiGe source/drain regions 502a, 502b (FIGS. 5A & 5B) that contact (via the fin facets) the multiple fins 102a-102c at the gate spacers 202a, 202b. Thus, the SiGe source/drain regions 502a, 502b (FIGS. 5A & 5B) contact (via the fin facets) the multiple fins 102a-102c at a location that is in relatively closer proximity to the channel region, whereby the channel region may be formed within the regions of the multiple fins 102a-102c underlying the gate structure 104.

Dopants such as boron may be incorporated into the SiGe source/drain regions 502a, 502b (FIG. 5B) by in-situ doping. The percentage of boron may range from 1E19 cm$^{-3}$ to 2E21 cm$^{-3}$, preferably 1E20 cm$^{-3}$ to 1E21 cm$^{-3}$. In a preferred exemplary embodiment, the percentage of boron may range from 4E20 cm$^{-3}$ to 7E20 cm$^{-3}$. Based on the removed portions of the multiple fins 102a, 102b, 102c and the deposition of the SiGe source/drain regions 502a, 502b (FIG. 5B), the doped boron may controllably diffuse into the multiple fins 102a, 102b, 102c near the channel region, which accordingly causes an increased conductivity in the channel.

Figure 5B:
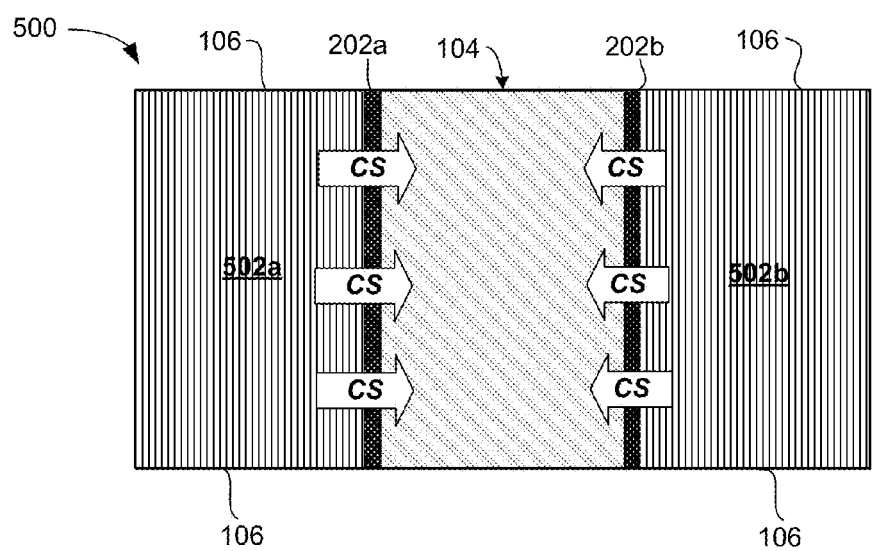
FIG. 5B is a plan view of the structure of FIG. 5A.
Figure 5C:
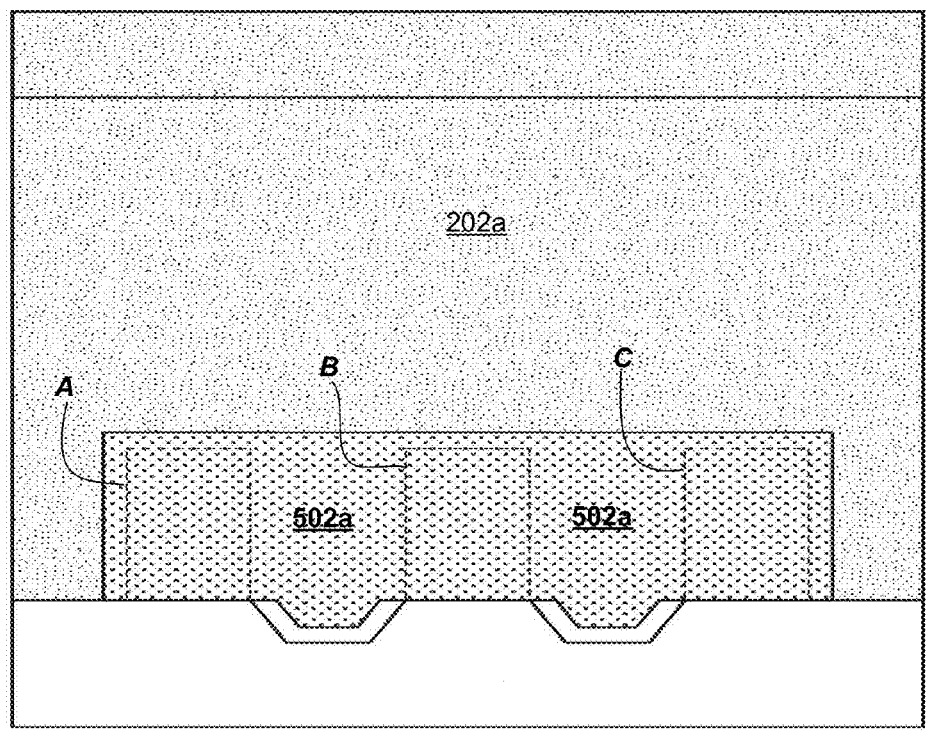
FIG. 5C is cross sectional view of the structure of FIG. 5A along axis D-D'.

Referring to FIGS. 5A & 5B, for example, in-situ doped Boron-SiGe source/drain regions 502a, 502b may be deposited by growing the Boron-SiGe source/drain regions 502a, 502b in an outward direction, as defined by arrow O, according to a '1 1 0' directional growth. Additionally, the in-situ doped Boron-SiGe source/drain regions 502a, 502b may be deposited by growing the Boron-SiGe source/drain regions 502a, 502b in an upward direction, as defined by arrow U, according to a '1 0 0' directional growth. For example, the upward '1 0 0' directional growth may be 40% faster relative to the outward '1 1 0' directional growth such that the height H of the Boron-SiGe source/drain regions 502a, 502b may be approximately 60-70 nm, while the thickness T of the Boron-SiGe source/drain regions 502a, 502b may be about 300-1000 Å. By increasing the height H of the Boron-SiGe source/drain regions 502a, 502b, more volume of Boron-SiGe material is produced, which in turn accounts for an increase in strain between the Boron-SiGe source/drain regions 502a, 502b and the channel region.

Figure 6A:
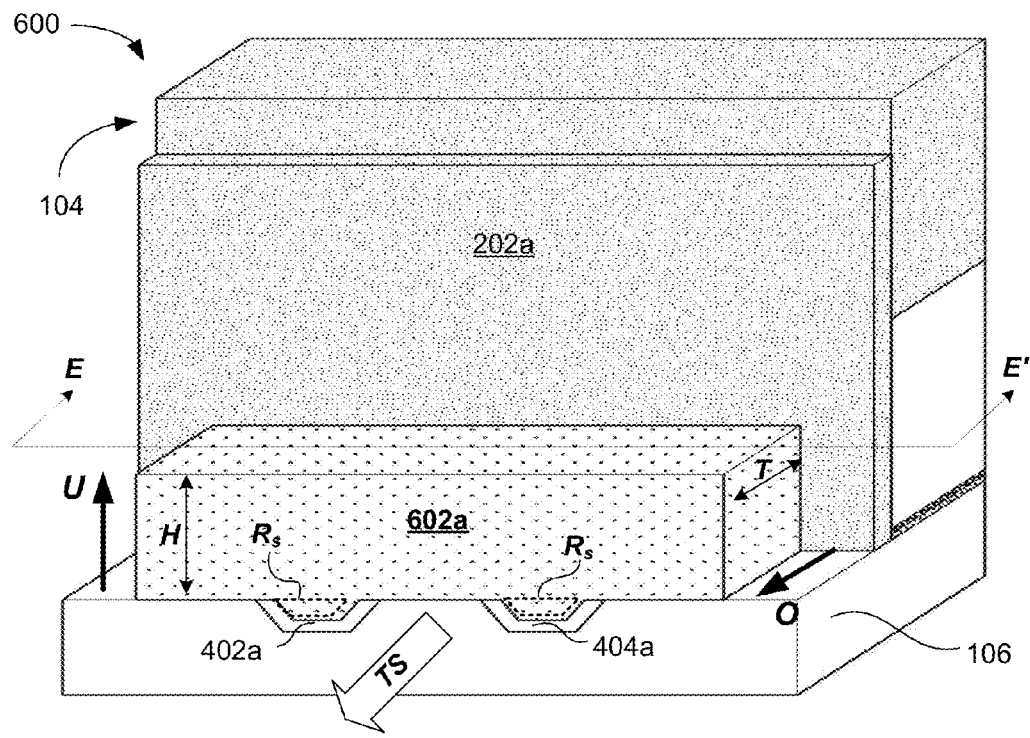
FIG. 6A is a isometric view illustrating the formation of another type of epitaxial source/drain stressor region for the FinFET structure of FIG. 4A, according to an exemplary embodiment.

FIG. 6A is an isometric view of a FinFET structure 600 following the deposition of source/drain regions 602a, 602b (FIG. 6B) including stressor materials (e.g., SiC:P) over the recessed epitaxial seed layers 402a, 404a, 402b (FIG. 4B), 404b (FIG. 4B) within the recesses regions $R_s$ of FinFET structure 400. As depicted, the source/drain regions 602a, 602b (FIG. 6B) are deposited over the BOX layer 106 filling the recesses regions $R_s$, while abutting the end facets 412a, 412b, 412c (FIG. 4A) of the multiple fins 102a, 102b, 102c (FIG. 4A). As illustrated in FIG. 6C, which is a cross sectional view of FIG. 6A along axis E-E'; region A' of the rear surface of source/drain region 602a abuts end facet 412a (FIG. 4A) of fin 102a (FIG. 4A); region B' of the rear surface of source/drain region 602a abuts end facet 412b (FIG. 4A) of fin 102b (FIG. 4A); and region C' of the rear surface of source/drain region 502a abuts end facet 412c (FIG. 4A) of fin 102c (FIG. 4A). Source/drain region 502b (FIG. 5B) abuts the opposing end facets (not shown) of facets 412a, 412b, and 412c in an identical or substantially similar manner to that illustrated in relation to FIG. 6A.

For example, for a nFET FinFET device, the epitaxially grown source/drain regions 602a, 602b (FIG. 5B) may include a carbon doped Silicon (Si:C) type material, whereby the atomic concentration of carbon (C) may range from about 0.4-3.0%, preferably from about 0.5-2.5%. In a preferred exemplary embodiment, the concentration of carbon (C) may be approximately 1.5-2.2%.

The Si:C source/drain regions 602a, 602b (FIG. 6B) provide a tensile strain in relation to the underlying epitaxial seed layers 402a, 404a, 402b (FIG. 4B), 404b (FIG. 4B) and the end facets 412a, 412b, 412c (FIG. 4A) of the multiple fins 102a, 102b, 102c (FIG. 4A). Thus, the Si:C epitaxially grown source/drain regions 602a, 602b (FIG. 5B) exert a longitudinal tensile strain in the direction of arrows TS with respect to the remaining portions of the multiple fins 102a, 102b, 102c that extend between spacers 202a and 202b. More particularly, the tensile strain between the Si:C source/drain regions 602a, 602b (FIG. 5B) and the underlying epitaxial seed layers 402a, 404a, 402b (FIG. 4B), 404b (FIG. 4B) is transferred directly to the end facets 412a, 412b, 412c, which are proximally located with respect to the channel region (not shown) of the multiple fins 102a, 102b, 102c underlying the gate structure 104. Additionally, tensile stress to the channel region is also provided between the Si:C source/drain regions 602a, 602b (FIG. 6B) and the surfaces of the end facets 412a, 412b, 412c (FIG. 4A) abutting the Si:C source/drain regions 602a, 602b (FIG. 6B).

In contrast to the illustrated and described embodiment of FIG. 6A, the portions of the multiple fins 102a-102c (FIGS. 2A & 2B) that extend out from the gate spacers 202a, 202b (FIGS. 2A & 2B) may be retained (i.e., not etched away), and Si:C source/drain regions (not shown) providing compressive strain may be grown over these extended portions. In such a contrasting implementation, however, tensile strain may be transferred indirectly from the Si:C source/drain regions to the channel region via the extended portions of the multiple fins 102a-102c (FIGS. 2A & 2B). Accordingly, less stress may be transferred to the channel region relative to the exemplary embodiment of FIG. 6A, whereby the portions of the multiple fins 102a-102c (FIGS. 2A & 2B) that extend out from the gate spacers 202a, 202b (FIGS. 2A & 2B) are removed and replaced by Si:C source/drain regions 602a, 602b (FIGS. 6A & 6B) that contact (via the fin facets) the multiple fins 102a-102c at the gate spacers 202a, 202b. Thus, the Si:C source/drain regions 602a, 602b (FIGS. 6A & 6B) contact (via the fin facets) the multiple fins 102a-102c at a location that is in relatively closer proximity to the channel region, whereby the channel region may be formed within the regions of the multiple fins 102a-102c underlying the gate structure 104.

Dopants such as phosphorous (P) or arsenic (As) may be incorporated into the Si:C source/drain regions 602a, 602b (FIG. 6B) by in-situ doping. The percentage of phosphorous or arsenic may range from 1E19 $cm^{-3}$ to 2E21 $cm^{-3}$, preferably 1E20 $cm^{-3}$ to 1E21 $cm^{-3}$. In a preferred exemplary embodiment, the percentage of boron may range from 4E20 $cm^{-3}$ to 7E20 $cm^{-3}$. Based on the removed portions of the multiple fins 102a, 102b, 102c and the deposition of the Si:C source/drain regions 602a, 602b (FIG. 6B), the doped phosphorous (P) or arsenic (As) may controllably diffuse into the multiple fins 102a, 102b, 102c near the channel region, which accordingly causes an increased conductivity in the channel.

Figure 6B:
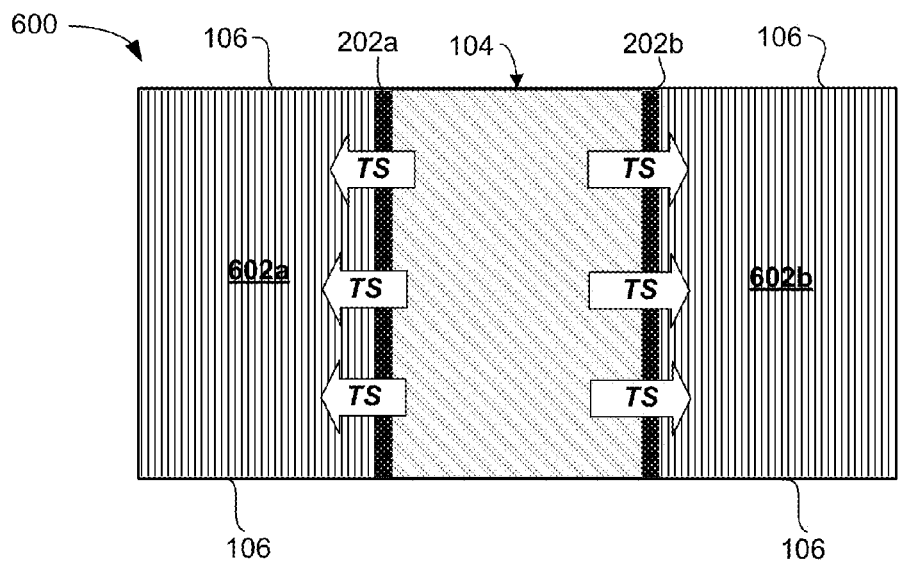
FIG. 6B is a plan view of the structure of FIG. 6A.
Figure 6C:
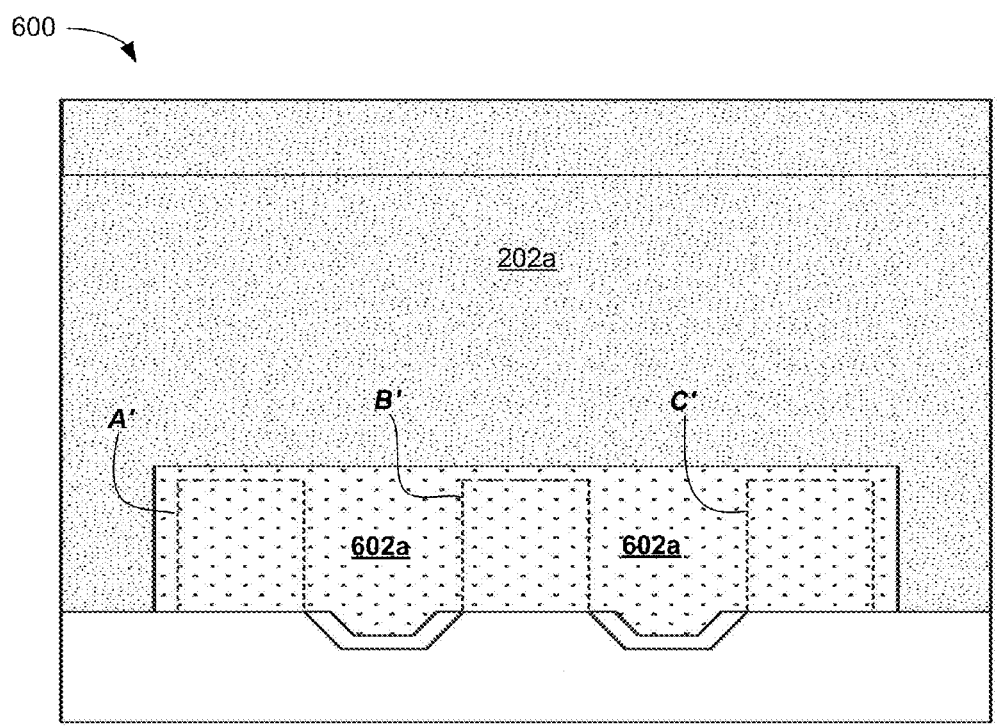
FIG. 6C is cross sectional view of the structure of FIG. 6A along axis E-E'.

Referring to FIGS. 6A & 6B, for example, in-situ doped SiC:P source/drain regions 602a, 602b may be deposited by growing the SiC:P source/drain regions 602a, 602b in an outward direction, as defined by arrow O, according to a '1 1 0' directional growth. Additionally, the in-situ doped SiC:P source/drain regions 602a, 602b may be deposited by growing the SiC:P source/drain regions 602a, 602b in an upward direction, as defined by arrow U, according to a '1 0 0' directional growth. For example, the upward '1 0 0' directional growth may be 40% faster relative to the outward '1 1 0' directional growth such that the height H of the SiC:P source/drain regions 602a, 602b may be approximately 60-70 nm, while the thickness T of the SiC:P source/drain regions 502a, 502b may be about 300-1000 Å. By increasing the height H of the SiC:P source/drain regions 502a, 502b, more volume of SiC:P material is produced, which in turn accounts for an increase in strain between the SiC:P source/drain regions 502a, 502b and the channel region.

Thus, in accordance with the above described embodiments, by replacing the portions of fins extending out of the spacer regions of the FinFet device with a volume of stress generating epitaxial source/drain materials, increased channel region stress and, therefore, increased channel carrier mobility may be exhibited.

Figure 7:
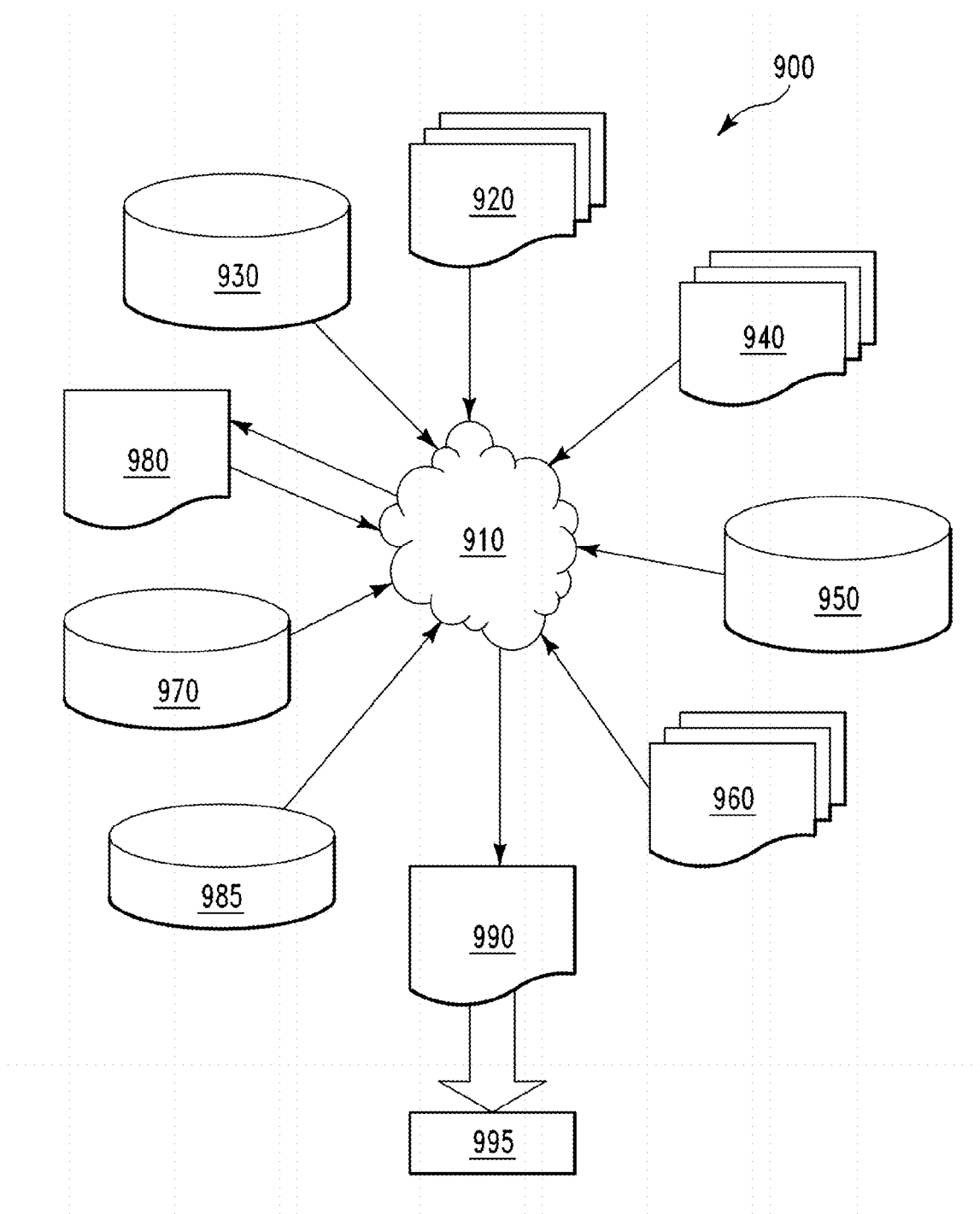
FIG. 7 is a flow diagram of a design process used in semiconductor design, manufacture, and/or test.

FIG. 7 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 5A & 6A. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. In one embodiment, the design structure 920 comprises design data used in a design process and comprising information describing one or more embodiments of the invention with respect to the structures as shown in FIGS. 5A & 6A. The design data in the form of schematics or HDL, a hardware-description language (e.g., Verilog, VHDL, C, etc.) may be embodied on one or more machine readable media. For example, design structure 920 may be a text file, numerical data or a graphical representation of the one or more embodiments of the invention, as shown in FIGS. 5A & 6A. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 5A & 6A. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 5A & 6A to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5A & 6A. In one embodiment, design structure 990 may comprise a compiled, executable HDL simulation model that functionally simulates the devices shown in FIGS. 5A & 6A.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 5A & 6A. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method of forming a semiconductor structure comprising:
  providing a buried oxide layer having a surface;
  forming, on the surface of the buried oxide layer, at least one fin having sidewalls;
  forming, over a first portion of the at least one fin structure, a gate structure having sidewalls, wherein a channel region is located under the gate structure within the first portion of the at least one fin;
  forming gate spacers on the sidewalls of the gate structure by etching a deposited dielectric from over the at least one fin, wherein the etching of the dielectric undercuts the surface of the buried oxide layer and creates recessed regions within the surface of the buried oxide layer along a location adjacent the sidewalls of a second portion of the at least one fin that extends outwardly from one of the gate spacers;
  forming a first epitaxial region that covers both one of the recessed regions and the second portion of the at least one fin that extends outwardly from one of the gate spacers;
  forming a first epitaxial layer within the one of the recessed regions by etching the first epitaxial region and the second portion of the at least one fin down to the surface of the buried oxide layer; and forming a second epitaxial region over both the surface of the buried oxide layer at a location adjacent the one of the gate spacers and the first epitaxial layer within the one of the recessed regions.

2. The method of claim 1, wherein forming the first epitaxial layer comprises growing a silicon seed material layer within the one of the recessed regions.

3. The method of claim 2, wherein forming the second epitaxial region comprises epitaxially growing an embedded stressor material over the silicon seed material layer for providing stress on the channel region.

4. The method of claim 3, wherein the embedded stressor material includes a silicon germanium material for providing compressive stress on the channel region.

5. The method of claim 3, wherein the embedded stressor material includes a carbon doped silicon material for providing tensile tress on the channel region.

6. The method of claim 1, further comprising:
forming a third epitaxial region that covers both another one of the recessed regions and a third portion of the at least one fin, the third portion extending outwardly from one of the other gate spacers;
forming a second epitaxial layer within the another one of the recessed regions by etching the third epitaxial region and the third portion of the at least one fin down to the surface of the buried oxide layer; and
forming a fourth epitaxial region over both the surface of the buried oxide layer at a location adjacent the one of the other gate spacers and the second epitaxial layer within the another one of the recessed regions.

7. The method of claim 6, wherein forming the second epitaxial layer comprises growing a silicon seed material layer within the another one of the recessed regions.

8. The method of claim 7, wherein forming the fourth epitaxial region comprises epitaxially growing an embedded stressor material over the silicon seed layer within the another one of the recessed regions for providing stress on the channel region.

9. The method of claim 8, wherein the embedded stressor material includes a silicon germanium material for providing compressive stress on the channel region.

10. The method of claim 8, wherein the embedded stressor material includes a carbon doped silicon material for providing tensile tress on the channel region.

11. A method of applying stress to a channel region of a FinFet structure having at least one fin structure, the method comprising:

forming a gate structure over a first portion of the at least one fin structure, the first portion of the at least one fin structure having a first and a second end facet;
forming a first spacer and a second spacer on respective sidewalls of the gate structure;
removing a second portion of the at least one fin structure having opposing sidewalls, wherein the second portion extends outwardly beyond the first spacer;
removing a third portion of the at least one fin structure having opposing sidewalls, wherein the third portion extends outwardly beyond the second spacer;
depositing a first epitaxial region both in place of the removed second portion of the at least one fin structure and within a first recess region including at least one epitaxial layer, wherein the deposited first epitaxial region abuts the first end facet of the first portion of the at least one fin structure; and
depositing a second epitaxial region both in place of the removed third portion of the at least one fin structure and within a second recess region including at least one other epitaxial layer, wherein the deposited epitaxial region abuts the second end facet of the first portion of the at least one fin structure,
wherein the first epitaxial region and the second epitaxial region apply stress to the channel region located under the gate structure within the first portion of the at least one fin, and wherein the first and the second gate spacer are formed on the respective sidewalls of the gate structure by etching a deposited dielectric layer from over the second and the third portion of the at least one fin structure, wherein the etching of the dielectric layer for forming the first and second gate spacer simultaneously creates the first recessed region along a location adjacent the opposing sidewalls of the second portion of the at least one fin that extends outwardly beyond the first spacer and creates the second recessed region along a location adjacent the opposing sidewalls of the third portion of the at least one fin that extends outwardly beyond the second spacer.

12. The method of claim 11, wherein the first epitaxial region and the second epitaxial region applying stress to the channel comprise applying a compressive stress.

13. The method of claim 11, wherein the first epitaxial region and the second epitaxial region applying stress to the channel comprise applying a tensile stress.

* * * * *